(12) United States Patent
Cha et al.

(10) Patent No.: US 9,245,651 B2
(45) Date of Patent: Jan. 26, 2016

(54) MEMORY DEVICE FOR MASKING READ DATA AND A METHOD OF TESTING THE SAME

(71) Applicant: SAMSUNG ELECTRONICS CO., LTD., Suwon-si, Gyeonggi-do (KR)

(72) Inventors: Jeong Yun Cha, Asan-si (KR); Yun Kil Kim, Suwon-si (KR); Jeong Hwa Jeong, Asan-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/330,424

(22) Filed: Jul. 14, 2014

(65) Prior Publication Data

US 2015/0016200 A1    Jan. 15, 2015

(30) Foreign Application Priority Data

Jul. 15, 2013   (KR) .................. 10-2013-0083004

(51) Int. Cl.
| | | |
|---|---|---|
| *G11C 7/00* | (2006.01) | |
| *G11C 29/12* | (2006.01) | |
| *G11C 7/10* | (2006.01) | |
| *G11C 11/4096* | (2006.01) | |
| *G11C 29/26* | (2006.01) | |

(52) U.S. Cl.
CPC .......... *G11C 29/1201* (2013.01); *G11C 7/1009* (2013.01); *G11C 11/4096* (2013.01); *G11C 2029/2602* (2013.01)

(58) Field of Classification Search
CPC .. G11C 11/4096; G11C 11/4076; G11C 7/22; G11C 11/005; G11C 7/103; G11C 7/1051; G11C 7/1072; G11C 2029/2602; G11C 29/1201; G11C 7/1009; G11C 11/409; G11C 2207/2254

USPC ........... 365/189.011, 189.05, 189.11, 230.08, 365/233.1, 189.12, 189.17, 233.11

See application file for complete search history.

(56) References Cited

U.S. PATENT DOCUMENTS

| | | | |
|---|---|---|---|
| 6,360,340 B1 | 3/2002 | Brown et al. | |
| 6,842,031 B2 | 1/2005 | Koh et al. | |
| 7,679,969 B2 | 3/2010 | Ku | |
| 7,707,469 B2 | 4/2010 | Lee et al. | |
| 8,107,314 B2 | 1/2012 | Hara | |
| 2009/0196107 A1* | 8/2009 | Ogasawara et al. ...... | 365/189.05 |

FOREIGN PATENT DOCUMENTS

| | | |
|---|---|---|
| JP | 10-010204 | 1/1998 |
| JP | 2003-151300 | 5/2003 |
| KR | 1020050108758 | 11/2005 |
| KR | 1020090093557 | 9/2009 |
| KR | 1020090105094 | 10/2009 |
| KR | 1020100030510 | 3/2010 |

* cited by examiner

*Primary Examiner* — Thong Q Le
(74) *Attorney, Agent, or Firm* — F. Chau & Associates, LLC

(57) ABSTRACT

A memory device includes a memory array, a plurality of input/output pins, a mask signal generator, an input/output block. The memory array is configured to output read data including a plurality of data bits. The mask signal generator is configured to generate at least one data mask signal. The input/output block is configured to mask bits having a logic level among the plurality of data bits in the read data to output the masked read data to the plurality of input/output pins.

19 Claims, 19 Drawing Sheets

MEMORY DEVICE FOR MASKING READ DATA AND A METHOD OF TESTING THE SAME

CROSS-REFERENCE TO RELATED PATENT APPLICATION

This application claims priority under 35 U.S.C. §119 to Korean Patent Application No. 10-2013-0083004, filed on Jul. 15, 2013, in the Korean Intellectual Property Office, the disclosure of which is incorporated by reference herein in its entirety.

TECHNICAL FIELD

The present inventive concept relates to a memory device, and more particularly a memory device for masking read data and a method of testing the same.

DISCUSSION OF THE RELATED ART

A memory device such as dynamic random access memory (DRAM) is tested to detect a fault in a circuit thereof at a wafer stage or a package stage. A parallel test in which a single tester tests a plurality of memory devices at a time is used to reduce a test time.

A merged-DQ scheme is used to increase the number of memory devices tested at a time in the parallel test.

In the merged-DQ scheme, a plurality of DQ pins (e.g., input/output pins) of a memory device is connected to a single channel of a tester. Thus, data can be simultaneously input to the plurality of DQ pins through the single channel in a write operation. In a read operation, data is individually read from each DQ pin, which increases the test time.

SUMMARY

According to an exemplary embodiment of the present inventive concept, a memory device is provided. The memory device includes a memory array, a plurality of input/output pins, a mask signal generator, and an input/output block. The memory array is configured to output read data including a plurality of data bits. The mask signal generator is configured to generate at least one data mask signal. The input/output block is configured to mask bits having a first logic level among the plurality of data bits in the read data and to output the masked read data to the plurality of input/output pins. The first logic level corresponds to the at least one data mask signal.

The at least one data mask signal may be generated based on a logic level output from the plurality of input/output pins when the memory device is normal.

The input/output block may include a plurality of input/output circuits. The input/output circuits may correspond to each of the input/output pins. Each of the input/output circuits may include a pull-up unit and a pull-down unit. The pull-up unit may be configured to mask a PMOS enable signal according to a first data mask signal among the at least one data mask signal to generate a PMOS masking signal and to pull up the input/output pins according to the PMOS masking signal. The pull-down unit may be configured to mask an NMOS enable signal according to a second data mask signal among the at least one data mask signal to generate an NMOS masking signal and to pull down the input/output pins according to the NMOS masking signal. The PMOS enable signal and the NMOS enable signal may correspond to the read data.

The pull-up unit may include a pull-up transistor. The pull-up transistor may be connected between a first reference voltage and a corresponding input/output pin among the plurality of input/output pins to pull up the corresponding input/output pin according to the PMOS masking signal. The pull-down unit may include a pull-down transistor. The pull-down transistor may be connected between a second reference voltage and the corresponding input/output pin to pull down the corresponding input/output pin according to the NMOS masking signal. The pull-up transistor may be deactivated when the first data mask signal is activated and the pull-down transistor may be deactivated when the second data mask signal is activated.

The pull-up unit may include a pull-up inverter and a pull-up NOR gate. The pull-up inverter may be configured to invert the PMOS enable signal. The pull-up NOR gate may be configured to perform a NOR operation on an inverted PMOS enable signal and the first data mask signal to generate the PMOS masking signal. The pull-down unit may include a pull-down inverter and a pull-down NOR gate. The pull-down unit may be configured to invert the NMOS enable signal. The pull-down NOR gate may be configured to perform a NOR operation on an inverted NMOS enable signal and the second data mask signal to generate the NMOS masking signal.

The at least one data mask signal may be a first data mask signal according to at least one external input signal input to the memory device or a second data mask signal, according to the at least one external input signal input to the memory device. The first data mask signal may be used for masking a high level in the read data. The second data mask signal may be used for masking a low level in the read data.

The mask signal generator may include a first AND gate, an inverter, and a second AND gate. The first AND gate may be configured to perform an AND operation on the external input signal and a mask mode signal generated according to the TMRS and to generate the first data mask signal. The inverter may be configured to invert the external input signal. The second AND gate may be configured to perform an AND operation on the inverted external input signal and the mask mode signal and to generate the second data mask signal.

The mask signal generator may include a third AND gate and a fourth AND gate. The third AND gate may be configured to perform an AND operation on a first external input signal among the at least one external input signal and a mask mode signal generated according to the TMRS and to generate the first data mask signal. The fourth AND gate may be configured to perform an AND operation on a second external input signal among the at least one external input signal and the mask mode signal and to generate the second data mask signal.

At least two input/output pins may be connected to a single channel of a tester.

According to an exemplary embodiment of the present inventive concept, a method of testing a memory device is provided. The method includes at least two input/output pins and a memory array. The method includes masking bits having a first logic level in output data of the memory array, transmitting masked output data to corresponding input/output pins among the plurality of input/output pins, and determining whether a fail occurs in the memory device based on a combined output into generated by combining outputs of the corresponding input/output pins.

The first logic level may be a logic level at the corresponding input/output pins when the memory device is normal.

The masking of the bits having the first logic level in the output data may include putting the corresponding input/output pins to be in a high-impedance state when the output data is at the first logic level.

The first logic level may be predetermined according to a TMRS.

The first logic level may change according to an external input signal.

The method may be repeated according to a number of logic levels of the output data when the memory device is normal.

According to an exemplary embodiment of the present inventive concept, a memory device is provided. The memory device includes a memory array, N input/output pins, a read control circuit, and an input/output block. The memory array is configured to output read data including a plurality of data bits. The read control circuit is configured to receive the read data, and to generate N PMOS enable signals and N NMOS enable signals based on the read data. The input/output block includes N input/output circuits. Each of the N input/output circuits is configured to mask bits having a first logic level among the plurality of data bits in the read data. Each of the N input/output circuits is connected to a corresponding one of the N input/output pins.

BRIEF DESCRIPTION OF THE DRAWINGS

The above and other features of the present inventive concept will become more apparent by describing in detail exemplary embodiments thereof with reference to the attached drawings in which.

DETAILED DESCRIPTION OF THE EMBODIMENTS

Figure 1:
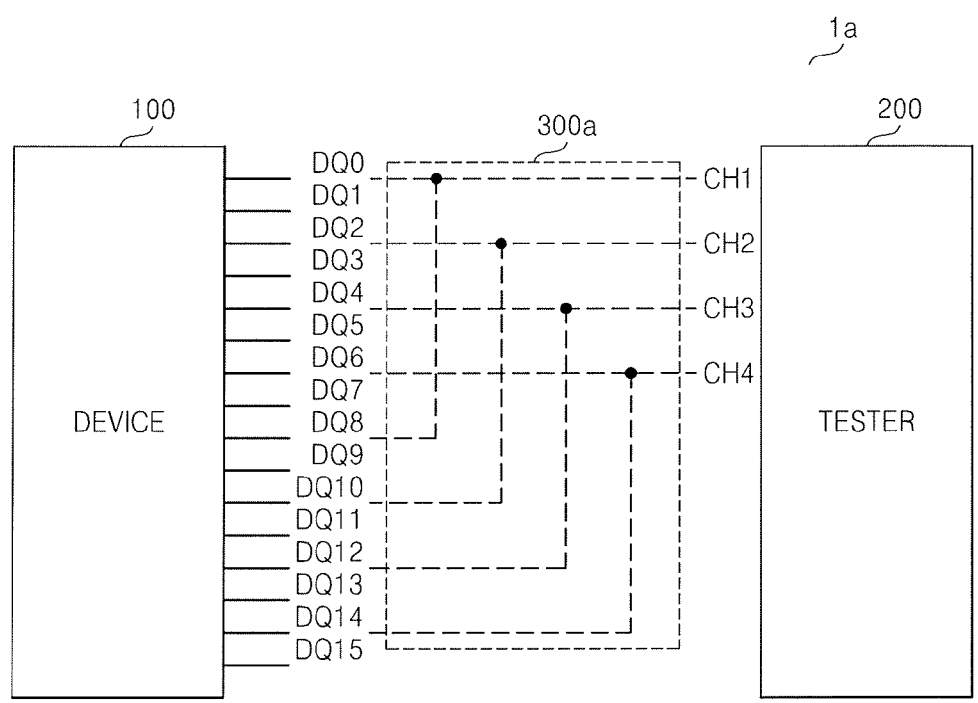
FIGS. 1 and 2 are diagrams of semiconductor test systems according to an exemplary embodiments of the present inventive concept.

The present inventive concept now will be described more fully hereinafter with reference to the accompanying drawings, in which exemplary embodiments thereof are shown. This present inventive concept may, however, be embodied in many different forms and should not be construed as limited to the embodiments set forth herein. In the drawings, the size and relative sizes of layers and regions may be exaggerated for clarity. Like numbers may refer to like elements throughout the specification and drawings.

It will be understood that when an element is referred to as being "connected" or "coupled" to another element, it can be directly connected or coupled to the other element or intervening elements may be present.

As used herein, the singular forms "a", "an" and "the" are intended to include the plural forms as well, unless the context clearly indicates otherwise.

Figure 2:
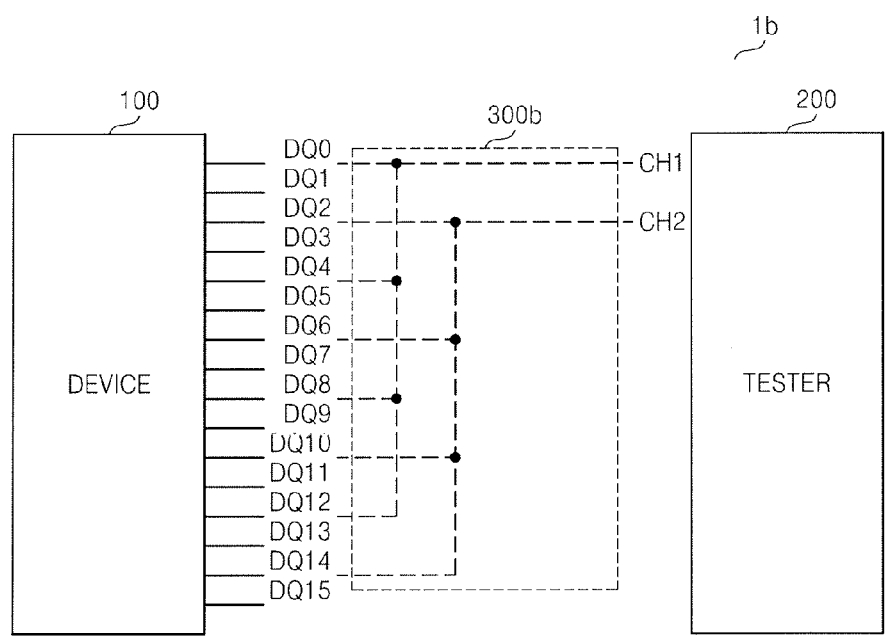

FIGS. 1 and 2 are diagrams of semiconductor test systems 1a and 1b according to exemplary embodiments of the present inventive concept. In detail, FIG. 1 shows a case where two input/output (I/O) pins DQ of a memory device 100 are connected to each channel of a tester 200 and FIG. 2 shows a case where four I/O pins DQ of the memory device 100 are connected to each channel of the tester 200.

Referring to FIG. 1, the semiconductor test system 1a includes the memory device 100, the tester 200, and a coupling circuit 300a. Two I/O pins DQ of the memory device 100 are connected to each channel of the tester 200 through the coupling circuit 300a. For instance, a first I/O pin DQ0 and a ninth I/O pin DQ8 may be connected to a first channel CH1. The coupling circuit 300a may include a cable and a conducting wire on a printed circuit board (PCB). When the memory device 100 has 16 I/O pins DQ0 through DQ15, the tester 200 may have eight channels to test the memory device 100.

Referring to FIG. 2, the semiconductor test system 1b includes the memory device 100, the tester 200, and a coupling circuit 300b. Four I/O pins DQ of the memory device 100 are connected to each channel of the tester 200 through the coupling circuit 300b. For instance, the first I/O pin DQ0, a fifth I/O pin DQ4, the ninth I/O pin DQ8, and a thirteenth I/O pin DQ12 may be connected to the first channel CH1. When the memory device 100 has 16 I/O pins DQ0 through DQ15, the tester 200 may have four channels to test the memory device 100.

Since the number of channels of the tester 200 is fixed, when the number of I/O pins connected to each channel increases, the number of memory devices 100 that can be tested at a time also increases. When a read DQ mask (RDQM) is used, since more I/O pins are connected to each channel, the test time is longer.

For instance, it is assumed that a high level is output from the first channel CH1 of the tester 200 to the first, fifth, ninth, and thirteenth I/O pins DQ0, DQ4, DQ8, and DQ12 to write data to the memory device 100. The memory device 100 masks and blocks the outputs of the fifth, ninth, and thirteenth I/O pins DQ4, DQ8, and DQ12. Thus, the first channel CH1 may read only the first I/O pin DQ0 and may check whether the high level that has been written to the first I/O pin DQ0 is read. Further, the memory device 100 masks and blocks the outputs of the first, ninth, and thirteenth I/O pins DQ0, DQ8, and DQ12. Thus, the first channel CH1 may read only the fifth I/O pin DQ4 and may check whether the high level that has been written to the fifth I/O pin DQ4 is read. The afore-described procedure is repeated to test the other I/O pins of the memory device 100. Thus, a test time of the memory device 100 may increase in proportion to the number of I/O pins connected to each channel.

According to an exemplary embodiment of the present inventive concept, the number of data readings required to test the memory device 100 is reduced by masking a particular data value (e.g., 0 or 1) of all I/O pins (e.g., DQ0, DQ4, DQ8, and DQ12) connected to each channel instead of sequentially masking the I/O pins (e.g., DQ0, DQ4, DQ8, and DQ12) when reading data. Thus, the test time for the memory device 100 is reduced.

Figure 3:
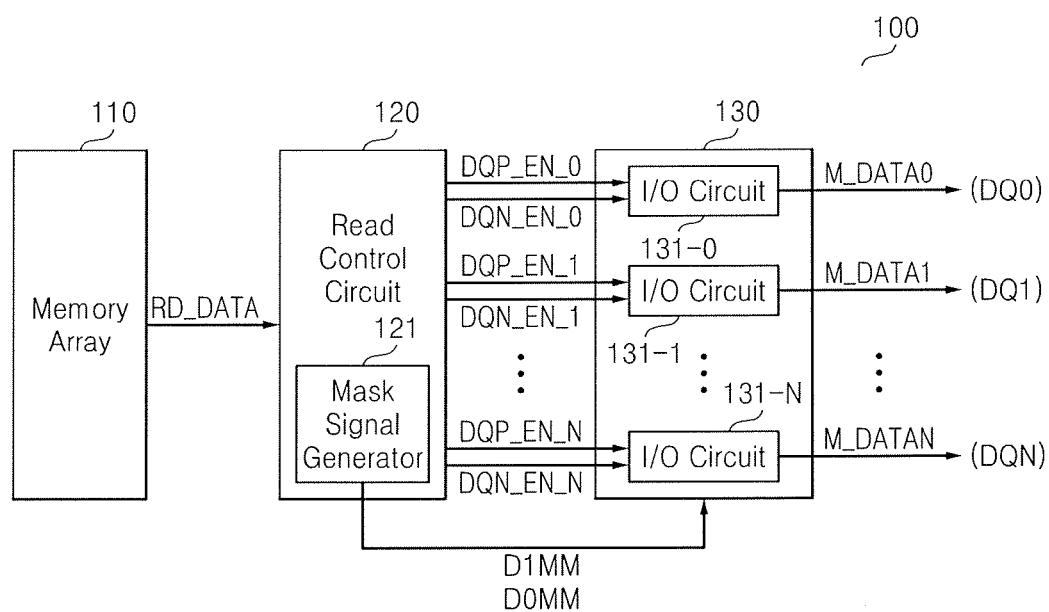
FIG. 3 is a block diagram of a memory device illustrated in FIGS. 1 and 2 according to an exemplary embodiments of the present inventive concept.

FIG. 3 is a block diagram of the memory device 100 illustrated in FIGS. 1 and 2 according to exemplary embodiments of the present inventive concept. Referring to FIG. 3, the memory device 100 includes a memory array 110, a read control circuit 120, and an I/O block 130. The I/O block 130 may include a plurality of I/O circuits 131-0 through 131-N.

The memory array 110 may include a plurality of memory cells. The memory array 110 may store read data RD_DATA in a data write operation and may output the read data RD_DATA in a data read operation. The memory array 110 may be implemented as a volatile or non-volatile memory device.

The volatile memory device may be implemented as dynamic random access memory (DRAM), static RAM (SRAM), thyristor RAM (T-RAM), zero capacitor RAM (Z-RAM), twin transistor RAM (TTRAM), or the like. The non-volatile memory device may be implemented as electrically erasable programmable read-only memory (EEPROM), flash memory, magnetic random access memory (MRAM), spin-transfer torque MRAM, conductive bridging RAM (CBRAM), ferroelectric RAM (FeRAM), phase-change RAM (PRAM), resistive RAM (RRAM), nanotube RRAM, polymer RAM (PoRAM), nano floating gate memory (NFGM), holographic memory, molecular electronic memory device, insulator resistance change memory, or the like.

The read control circuit 120 may read the read data RD_DATA from the memory array 110, and may generate and output PMOS enable signals DQP_EN_0 to DQP_EN_N and NMOS enable signals DQN_EN_0 to DQN_EN_N to the I/O block 130. The PMOS enable signals DQP_EN_0 to DQP_EN_N and the NMOS enable signals DQN_EN_0 to DQN_EN_N are related with the read data RD_DATA.

The read data RD_DATA may include a plurality of data bits. For example, when a data bit output to the first I/O pin DQ0 in the read data RD_DATA is at a high level, the read control circuit 120 may output the first PMOS enable signal DQP_EN_0 at a high level and the first NMOS enable signal DQN_EN_0 at a low level to the first I/O circuit 131-0. When the data bit output to the first I/O pin DQ0 is at a low level, the read control circuit 120 may output the first PMOS enable signal DQP_EN_0 at a low level and the first NMOS enable signal DQN_EN_0 at a high level to the first I/O circuit 131-0. However, the present inventive concept is not restricted to the above embodiments and operation of the read control circuit 120 may be modified in various ways.

The read control circuit 120 may include a mask signal generator 121. The mask signal generator 121 may generate and output one or more data mask signals D1MM and D0MM to the I/O block 130.

The I/O block 130 may mask a bit having a logic level that corresponds to the data mask signals D1MM and D0MM among the plurality of data bits of the read data RD_DATA and may generate masking data M_DATA. The I/O block 130 may include the I/O circuits 131-0 through 131-N that corresponds to the I/O pins DQ0 through DQN, respectively. The I/O circuits 131-0 through 131-N may have the same structure as each other. The I/O circuits 131-0 through 131-N may output masking data M_DATA0 through M_DATAN, respectively, to the I/O pins DQ0 through DQN.

Figure 4:
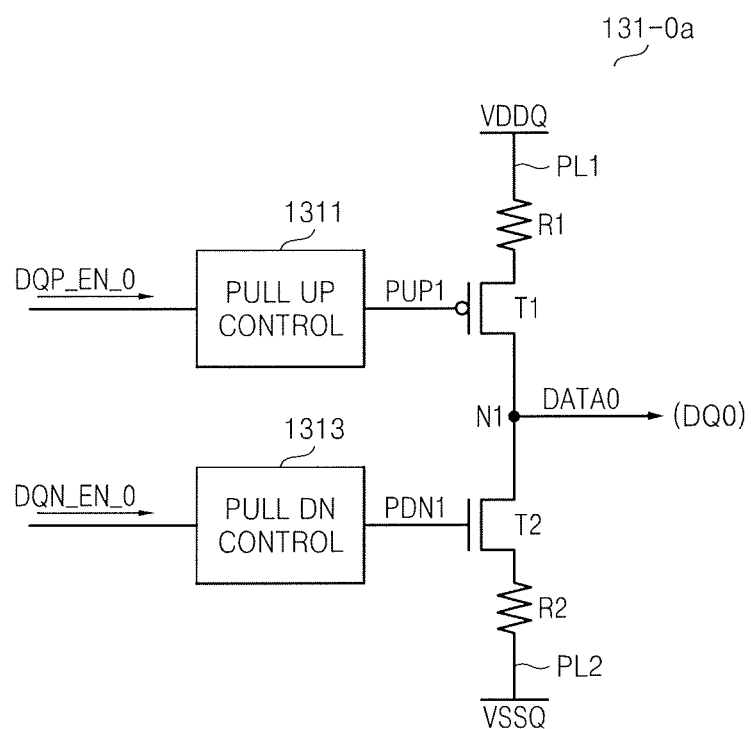
FIG. 4 is a circuit diagram of a first input/output (I/O) circuit in a comparison example.

FIG. 4 is a circuit diagram of the first I/O circuit in a comparison example. Referring to FIG. 4, a first I/O circuit 131-0a may include a first power line PL1, a second power line PL2, a pull-up control circuit 1311, a pull-down control circuit 1313, a pull-up transistor T1, a pull-down transistor T2, a pull-up resistor R1, and a pull-down resistor R2.

The first power line PL1 applies a first reference voltage VDDQ to the first I/O circuit 131-0a. The second power line PL2 applies a second reference voltage VSSQ to the first I/O circuit 131-0a.

The pull-up control circuit 1311 receives the first PMOS enable signal DQP_EN_0, generates a first pull-up signal PUP1 according to the first PMOS enable signal DQP_EN_0, and outputs the same. The first pull-up signal PUP1 may be an inverted signal of the first PMOS enable signal DQP_EN_0.

The pull-down control circuit 1313 receives the first NMOS enable signal DQN_EN_0, generates a first pull-down signal PDN1 according to the first NMOS enable signal DQN_EN_0, and outputs the same. The first pull-down signal PDN1 may be the same as the first NMOS enable signal DQN_EN_0.

The pull-up transistor T1 may be activated in response to the first pull-up signal PUP1 and may pull up a voltage of a first node N1 to the first reference voltage VDDQ. The pull-down transistor T2 may be activated in response to the first pull-down signal PDN1 and may pull down the voltage of the first node N1 to the second reference voltage VSSQ.

The pull-up resistor R1 may be connected between the pull-up transistor T1 and the first power line PL1. The pull-down resistor R2 may be connected between the pull-down transistor T2 and the second power line PL2. Resistance values of the pull-up resistor R1 and the pull-down resistor R2 may be set according to Pseudo Open Drain (POD)15 standardized by Joint Electron Device Engineering Council (JEDEC). However the present inventive concept is not restricted thereto.

The first node N1 is connected to the first I/O pin DQ0. Thus, first data DATA0 output to the first node N1 may be output to the first I/O pin DQ0. The first data DATA0 may be at a high level when the first PMOS enable signal DQP_EN_0 is at a high level. In addition, the first data DATA0 may be at a low level when the first NMOS enable signal DQN_EN_0 is at a high level. The first node N1 may be in a high-impedance (Hi-Z) state when both of the first PMOS enable signal DQP_EN_0 and the first NMOS enable signal DQN_EN_0 are at a low level.

Figure 5:
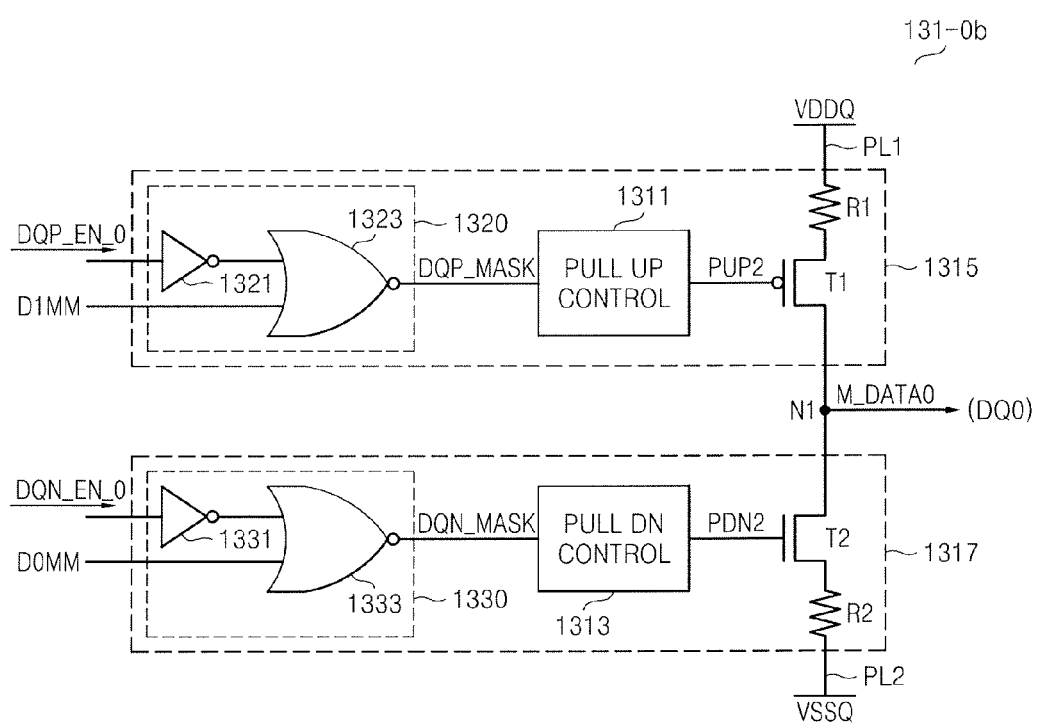
FIG. 5 is a circuit diagram of a first I/O circuit illustrated in FIG. 3 according to an exemplary embodiment of the present inventive concept.

FIG. 5 is a circuit diagram of the first I/O circuit illustrated in FIG. 3, according to an exemplary embodiment of the present inventive concept. Referring to FIGS. 3 through 5, the first I/O circuit 131-0*b* may include a first power line PL1, a second power line PL2, a pull-up unit 1315, and a pull-down unit 1317.

The first power line PL1 applies the first reference voltage VDDQ to the first I/O circuit 131-0*b*. The second power line PL2 applies the second reference voltage VSSQ to the first I/O circuit 131-0*b*.

The pull-up unit 1315 masks the first PMOS enable signal DQP_EN_0 according to the first data mask signal D1MM to generate a PMOS masking signal DQP_MASK, and pulls up the first node N1 and the first I/O pin DQ0 connected with the first node N1 according to the PMOS masking signal DQP_MASK. The pull-up unit 1315 may include the pull-up control circuit 1311, a pull-up logic circuit 1320, the pull-up transistor T1, and the pull-up resistor R1.

The pull-up logic circuit 1320 may mask the first PMOS enable signal DQP_EN_0 according to the first data mask signal D1MM and may generate the PMOS masking signal DQP_MASK. The pull-up logic circuit 1320 may include a pull-up inverter 1321 and a pull-up NOR gate 1323.

The pull-up inverter 1321 may invert the first PMOS enable signal DQP_EN_0. The pull-up NOR gate 1323 may perform a NOR operation on an inverted first PMOS enable signal DQP_EN_0 and the first data mask signal D1MM, and thus, may generate the PMOS masking signal DQP_MASK.

The pull-up control circuit 1311 receives the PMOS masking signal DQP_MASK, generates a second pull-up signal PUP2 according to the PMOS masking signal DQP_MASK, and outputs the same. The second pull-up signal PUP2 may be an inverted signal of the PMOS masking signal DQP_MASK.

The pull-up transistor T1 may be activated in response to the second pull-up signal PUP2 and may pull up the voltage of the first node N1 to the first reference voltage VDDQ. The pull-up resistor R1 may be connected between the pull-up transistor T1 and the first power line PL1.

The pull-down unit 1317 masks the first NMOS enable signal DQN_EN_0 according to the second data mask signal D0MM to generate an NMOS masking signal DQN_MASK, and pulls down the first node N1 and the first I/O pin DQ0 connected with the first node N1 according to the NMOS masking signal DQN_MASK. The pull-down unit 1317 may include the pull-down control circuit 1313, a pull-down logic circuit 1330, the pull-down transistor T2, and the pull-down resistor R2.

The pull-down logic circuit 1330 may mask the first NMOS enable signal DQN_EN_0 according to the second data mask signal D0MM and may generate the NMOS masking signal DQN_MASK. The pull-down logic circuit 1330 may include a pull-down inverter 1331 and a pull-down NOR gate 1333.

The pull-down inverter 1331 may invert the first NMOS enable signal DQN_EN_0. The pull-down NOR gate 1333 may perform a NOR operation on an inverted first NMOS enable signal DQN_EN_0 and the second data mask signal D0MM, and thus, may generate the NMOS masking signal DQN_MASK.

The pull-down control circuit 1313 receives the NMOS masking signal DQN_MASK, generates a second pull-down signal PDN2 according to the NMOS masking signal DQN_MASK, and outputs the same. The second pull-down signal PDN2 may be the same as the NMOS masking signal DQN_MASK.

The pull-down transistor T2 may be activated in response to the second pull-down signal PDN2 and may pull down the voltage of the first node N1 to the second reference voltage VSSQ. The pull-down resistor R2 may be connected between the pull-down transistor T2 and the second power line PL2.

The first node N1 is connected to the first I/O pin DQ0. Thus, the first masking data M_DATA0 output to the first node N1 may be output to the first I/O pin DQ0. The first masking data M_DATA0 may be a signal in which bits having a logic level corresponding to either of the data mask signals D1MM and D0MM among data bits of the first data DATA0 illustrated in FIG. 4 are masked.

For instance, one of the data mask signals D1MM and D0MM may be activated. The activated data mask signal D1MM or D0MM may correspond to a logic level output from a plurality of I/O pins DQ when the memory device 100 is normal (e.g., when no fail occurs in the memory device 100). In a case where a high level is output from the plurality of I/O pins DQ when the memory device 100 is normal, the first data mask signal D1MM may be activated. In a case where a low level is output from the plurality of I/O pins DQ when the memory device 100 is normal, the second data mask signal D0MM may be activated.

When the first data mask signal D1MM is activated to a high level, the pull-up transistor T1 is deactivated. The first masking data M_DATA0 may be a signal in which bits having a high level among data bits of the first data DATA0 are masked.

When the second data mask signal D0MM is activated to a high level, the pull-down transistor T2 is deactivated. The first masking data M_DATA0 may be a signal in which bits having a low level among data bits of the first data DATA0 are masked.

Figure 6:
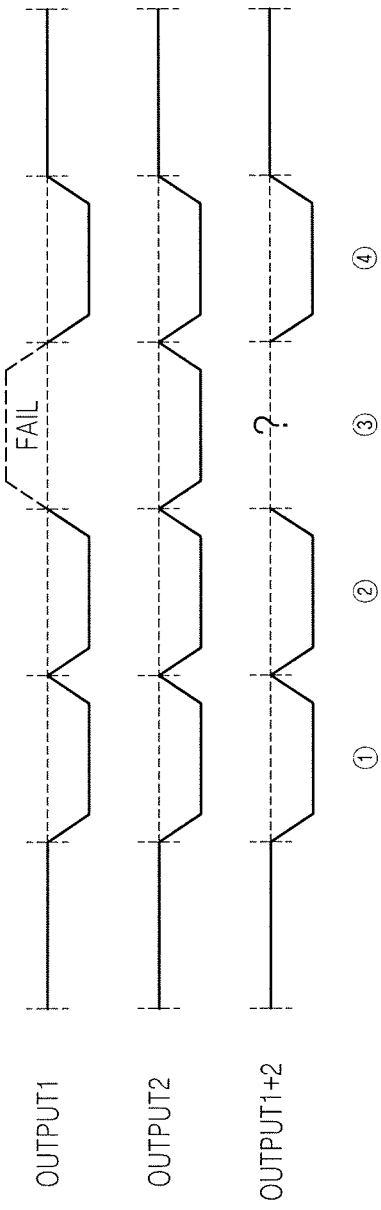
FIG. 6 is a timing chart of a data reading operation when a low level has been written to a plurality of I/O pins in a comparison example.
Figure 7:
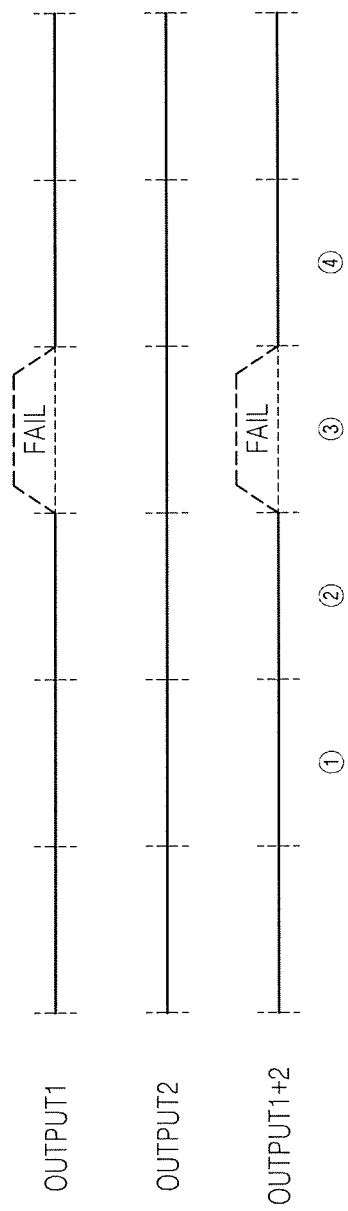
FIG. 7 is a timing chart of a data reading operation when a low level has been written to a plurality of I/O pins in an exemplary embodiment of the present inventive concept.

FIG. 6 is a timing chart of a data reading operation when a low level has been written to a plurality of I/O pins in a comparison example. FIG. 7 is a timing chart of a data reading operation when a low level has been written to a plurality of I/O pins in an exemplary embodiment of the present inventive concept. Referring to FIGS. 1, 6, and 7, an output of the first I/O pin DQ0 is referred to as a first output OUTPUT1 and an output of the ninth I/O pin DQ8 is referred to as a second output OUTPUT2. It is assumed that the first channel CH1 has written the low level in a data write operation.

Referring to FIG. 6, in a data read operation of the memory device 100, when the memory device 100 is normal (e.g., when no fail occurs in the memory device 100), the memory device 100 may output the low level in a first data period ①, a second data period ②, and a fourth data period ④. When the memory device 100 is not normal (e.g., when a fail occurs in the memory device 100), the memory device 100 may output a high level in a third data period rather than the low level.

Referring to FIG. 6, data input to the first channel CH1 (e.g., combined output data of the first and second outputs OUTPUT1 and OUTPUT2 (OUTPUT1+2)) might not be predicted when the first and second outputs OUTPUT1 and OUTPUT2 are combined without being masked. Thus, the second output OUTPUT2 may be read after the first output OUTPUT1 is read and two readings occur.

Referring to FIG. 7, the memory device 100 masks a logic level (e.g., the low level) that is output when the memory device 100 is normal to make the first and second outputs OUTPUT1 and OUTPUT2 to be in the Hi-Z state. Thus, the combined output data of the first and second outputs OUTPUT1 and OUTPUT2 (OUTPUT1+2) may be either at the high level or in the Hi-Z state. The first channel CH1 reads data, which corresponds to the combined output of the first and second outputs OUTPUT1 and OUTPUT2 (OUTPUT1+2), using a single reading. The tester 200 may determine that a fail has occurred in the memory device 100 when there is a high-level bit in the combined output data (OUTPUT1+2).

Figure 8:
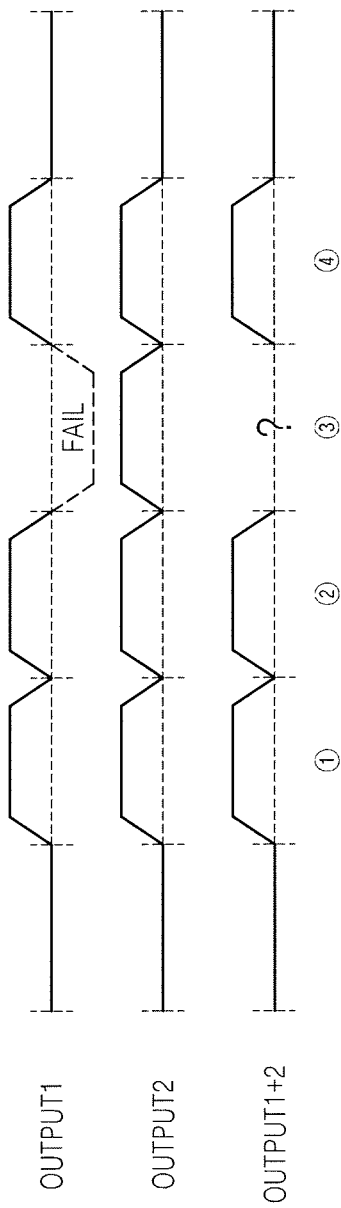
FIG. 8 is a timing chart of a data reading operation when a high level has been written to a plurality of I/O pins in a comparison example.
Figure 9:
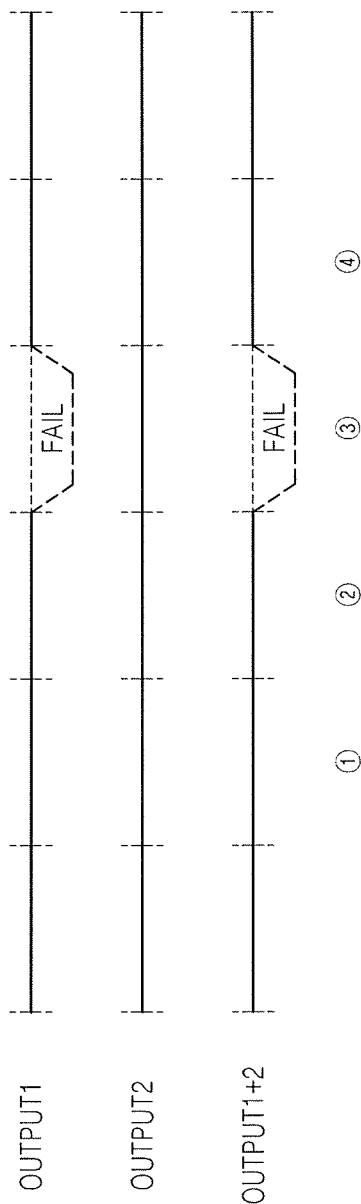
FIG. 9 is a timing chart of a data reading operation when a high level has been written to a plurality of I/O pins and the high level is masked in an exemplary embodiment of the present inventive concept.

FIG. 8 is a timing chart of a data reading operation when a high level has been written to a plurality of I/O pins in a comparison example. FIG. 9 is a timing chart of a data reading operation when a high level has been written to a plurality of I/O pins and the high level is masked in an exemplary embodiment of the present inventive concept. Referring to FIGS. 1, 8, and 9, an output of the first I/O pin DQ0 is referred to as a first output OUTPUT1 and an output of the ninth I/O pin DQ8 is referred to as a second output OUTPUT2. It is assumed that the first channel CH1 has written the high level in a data write operation.

Referring to FIG. 8, in a data read operation of the memory device 100, when the memory device 100 is normal (e.g., when no fail occurs in the memory device 100), the memory device may output the high level in the first data period ①, the second data period ②, and the fourth data period ④. When the memory device 100 is not normal (e.g., when a fail occurs in the memory device 100), the memory device 100 may output a low level in the third data period ③ rather than the high level.

Referring to FIG. 8, data input to the first channel CH1 (e.g., combined output data of the first and second outputs OUTPUT1 and OUTPUT2 (OUTPUT1+2)) might not be predicted when the first and second outputs OUTPUT1 and OUTPUT2 are combined without being masked. Thus, the second output OUTPUT2 may be read after the first output OUTPUT1 is read and two readings occur.

Referring to FIG. 9, the memory device 100 masks a logic level (e.g., the high level) that is output when the memory device 100 is normal to make the first and second outputs OUTPUT1 and OUTPUT2 to be in the Hi-Z state. Thus, the combined output data of the first and second outputs OUTPUT1 and OUTPUT2 (OUTPUT1+2) may be either at the low level or in the Hi-Z state. The first channel CH1 reads data, which corresponds to the combined output data of the first and second outputs OUTPUT1 and OUTPUT2 (OUTPUT1+2), using a single reading. The tester 200 may determine that a fail has occurred in the memory device 100 when there is a low-level bit in the combined output data.

Figure 10:
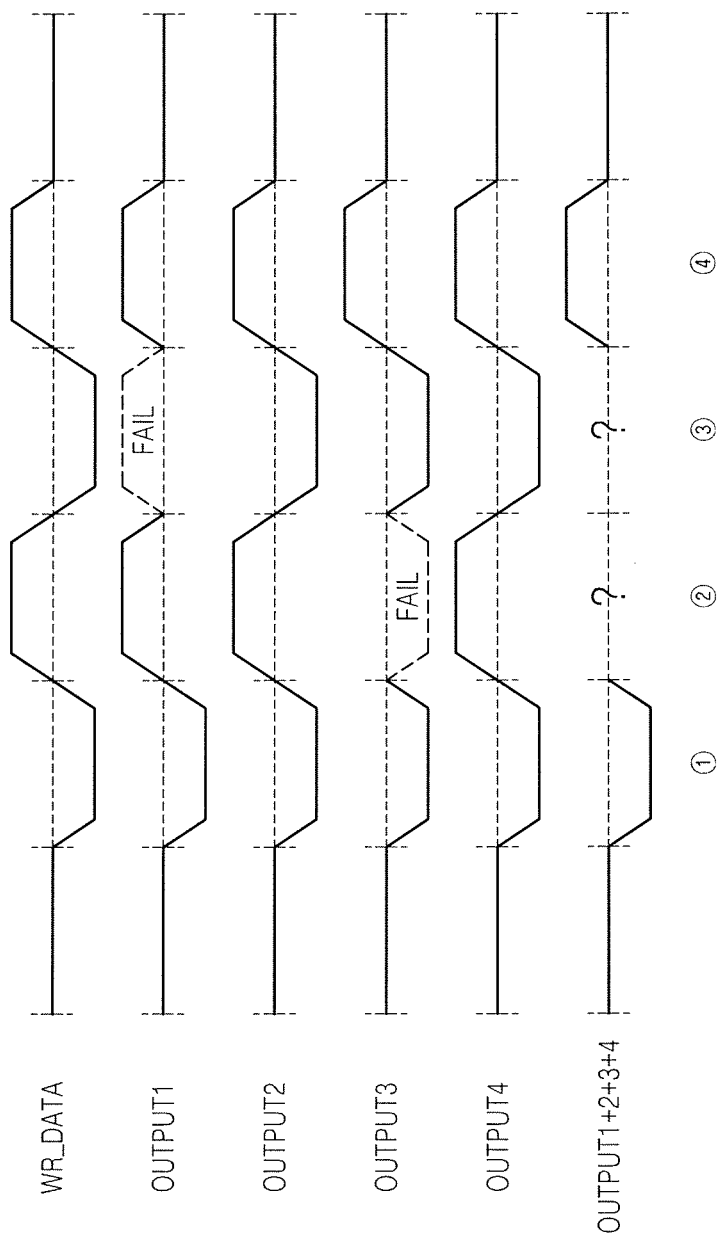
FIG. 10 is a timing chart of a data reading operation when a low level and a high level have been written to a plurality of I/O pins in a comparison example.
Figure 11:
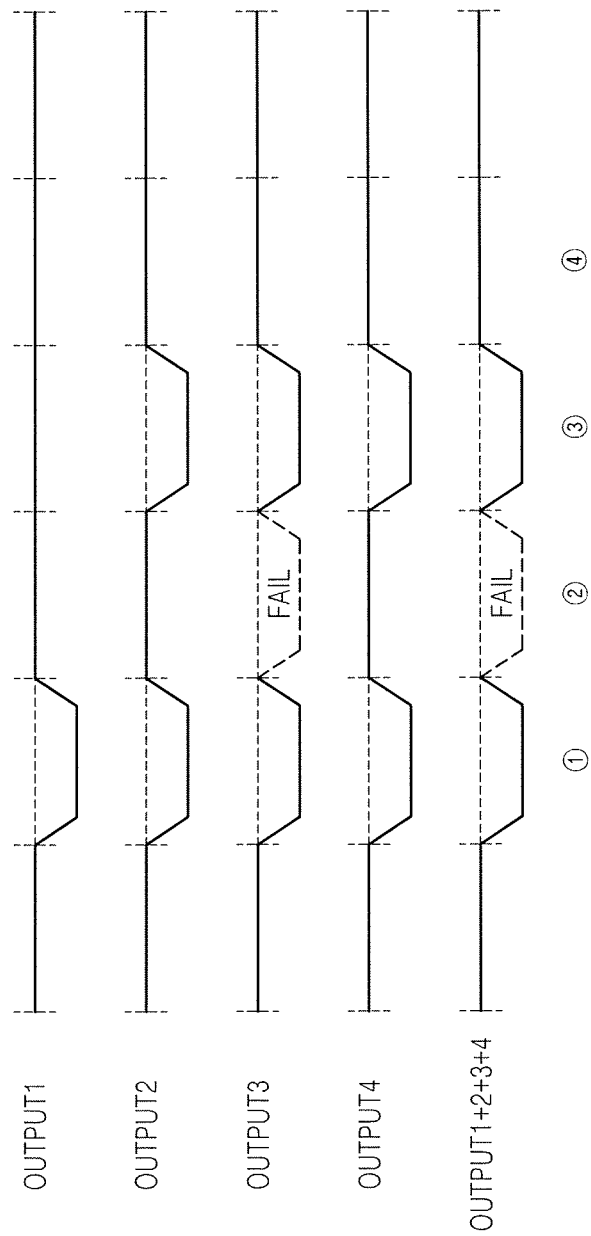
FIG. 11 is a timing chart of a data reading operation when a low level and a high level have been written to a plurality of I/O pins, and a high level is masked in an exemplary embodiment of the present inventive concept.
Figure 12:
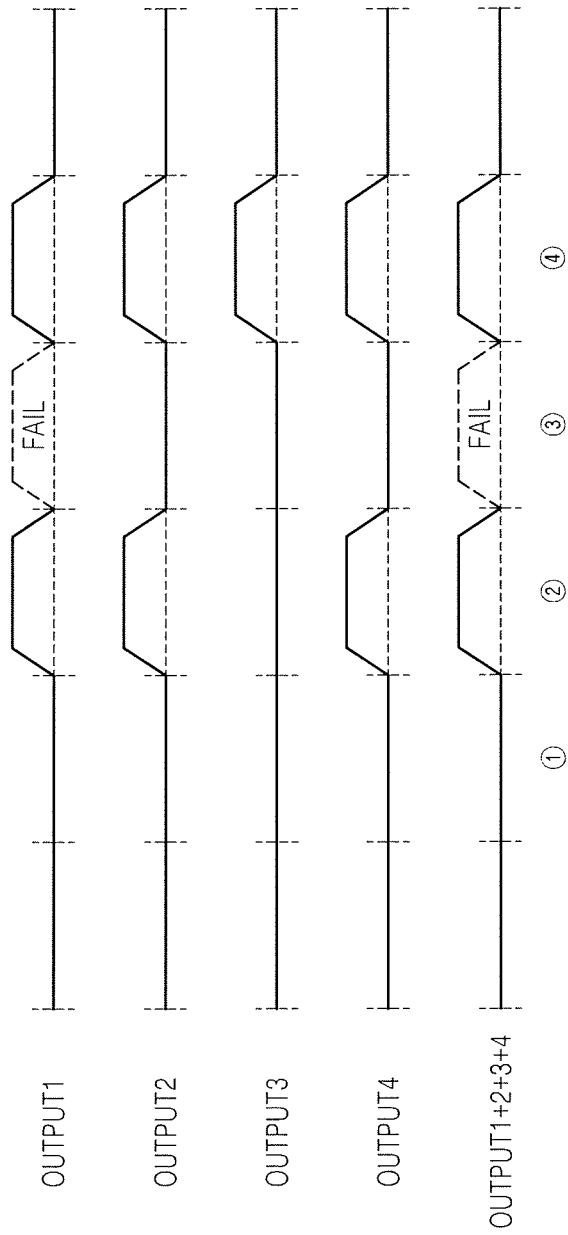
FIG. 12 is a timing chart of a data reading operation when a low level and a high level have been written to a plurality of I/O pins, and a low level is masked in an exemplary embodiment of the present inventive concept.

FIG. 10 is a timing chart of a data reading operation when the low level and the high level have been alternatively written to a plurality of I/O pins in a comparison example. FIG. 11 is a timing chart of a data reading operation when the low level and the high level have been alternatively written to the plurality of I/O pins like the comparison example of FIG. 10 and the high level is masked. FIG. 12 is a timing chart of a data reading operation when the low level and the high level have been alternatively written to the plurality of I/O pins like the comparison example of FIG. 10 and the low level is masked. Referring to FIG. 1 and FIGS. 10 through 12, an output of the first I/O pin DQ0 is referred to as a first output OUTPUT1, output of the fifth I/O pin DQ4 is referred to as a second output OUTPUT2, an output of the ninth I/O pin DQ8 is referred to as a third output OUTPUT3, and an output of the thirteenth I/O pin DQ12 is referred to as a fourth output OUTPUT4. It is assumed that the first channel CH1 has written write data WR_DATA in which the low and high levels alternate each other.

Referring to FIG. 10, in a data read operation of the memory device 100, when the memory device 100 is normal (e.g., when no fail occurs in the memory device 100), the first, second, third, and fourth outputs OUTPUT1 through OUTPUT4 may be at the low level in the first data period ② and at the high level in the fourth data period ④. When the memory device 100 is not normal (e.g., when a fail occurs in the memory device 100), the third output OUTPUT3 may be at the low level, which has been written, in the second period ② and the first output OUTPUT1 may be at the high level, which has been written, in the third data period ③.

Referring to FIG. 10, data input to the first channel CH1 (e.g., combined output data of the first, second, third, and fourth outputs OUTPUT1 through OUTPUT4 (OUTPUT1+2+3+4)) might not be predicted in the second period ② and the third data period ③ when the first, second, third, and fourth outputs OUTPUT1 through OUTPUT4 are combined without being masked. Thus, the first, second, third, and fourth outputs OUTPUT1 through OUTPUT4 are read sequentially and four readings occur.

Referring to FIG. 11, the memory device 100 masks the high level of the first, second, third, and fourth outputs OUTPUT1 through OUTPUT4 to make the first, second, third, and fourth outputs OUTPUT1 through OUTPUT4 to be in the Hi-Z state. Thus, the combined output data of the first, second, third, and fourth outputs OUTPUT1 through OUTPUT4 may be either at the low level or in the Hi-Z state. The first channel CH1 reads data, which corresponds to the combined output data of the first, second, third, and fourth outputs OUTPUT1 through OUTPUT4 (OUTPUT1+2+3+4). When the memory device 100 is normal (e.g., when there is no fail in the memory device 100), the combined output data (OUTPUT1+2+3+4) may be at the low level only in the first and third data periods ① and ③. The tester 200 may determine that a fail has occurred in the memory device 100 when it detects a low-level bit in the combined output data (OUTPUT1+2+3+4) in the second period ②.

Referring to FIG. 12, the memory device 100 masks the low level of the first, second, third, and fourth outputs OUTPUT1 through OUTPUT4 to make the first, second, third, and fourth outputs OUTPUT1 through OUTPUT4 to be in the Hi-Z state. Thus, the combined output data of the first, second, third, and fourth outputs OUTPUT1 through OUTPUT4 may be either at the high level or in the Hi-Z state. The first channel CH1 reads data, which corresponds to the combined output data of the first, second, third, and fourth outputs OUTPUT1 through OUTPUT4 (OUTPUT1+2+3+4). When the memory device 100 is normal (e.g., when there is no fail in the memory 100), the combined output data may be at the high level only in the second and fourth data periods ② and ④. The tester 200 may determine that a fail has occurred in the memory device 100 when it detects a high-level bit in the combined output data (OUTPUT1+2+3+4) in the third data period ③.

Thus, the tester 200 performs reading on the memory device 100 as many times as the number of logic levels that read data can have (e.g., two times when the read data has both the high level and the low level) when testing the memory device 100.

Figure 13:
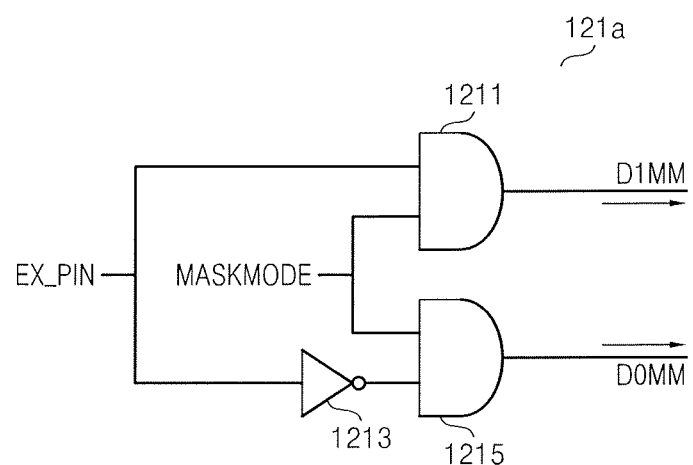
FIG. 13 is a circuit diagram of a mask signal generator illustrated in FIG. 3, according to an exemplary embodiment of the present inventive concept.

FIG. 13 is a circuit diagram of an example 121a of the mask signal generator 121 illustrated in FIG. 3, according to an exemplary embodiment of the present inventive concept. Referring to FIGS. 3 and 13, the mask signal generator 121a may operate according to a test mode register set (TMRS).

The TMRS may be stored in a mode register (MRS) or a register separated from the MRS. The TMRS may be set differently according to a command input to the memory device 100. The TMRS may be set according to a particular command (e.g., a TMRS command) and an input of an address pin.

In a parallel bit test (PBT), for example, when the same data bit is output from all I/O pins regardless of write data, a logic level (e.g., a high level or a low level) to be masked may be fixed. For example, the TMRS may be set to mask a high level when the TMRS command is received and there is an input to a first external pin. The TMRS may be set to mask a low level when the TMRS command is received and there is an input to a second external pin. Alternatively, the TMRS may be set to mask only either the high level or the low level regardless of inputs to external pins.

Switching between high-level masking and low-level masking may be performed on the fly. In an exemplary embodiment of the present inventive concept, the TMRS may be set to activate a mask mode enable signal MASKMODE in response to the TMRS command. The mask signal generator 121a may switch to either the high-level masking or the low-level masking according to the mask mode enable signal MASKMODE and an external input signal EX_PIN on the fly.

The mask signal generator 121a may generate and output the first data mask signal D1MM for masking a high-level value in the read data RD_DATA and the second data mask signal D0MM for masking a low-level value in the read data RD_DATA according to the external input signal EX_PIN input from the outside of the memory device 100. The mask signal generator 121a may include a first AND gate 1211, an inverter 1213, and a second AND gate 1215.

The first AND gate 1211 may perform an AND operation on the external input signal EX_PIN and the mask mode enable signal MASKMODE generated according to the TMRS, may generate the first data mask signal D1MM, and may output the same. The inverter 1213 may invert the external input signal EX_PIN. The second AND gate 1215 may perform an AND operation on an inverted external input signal and the mask mode enable signal MASKMODE, may generate the second data mask signal D0MM, and may output the same.

Figure 14:
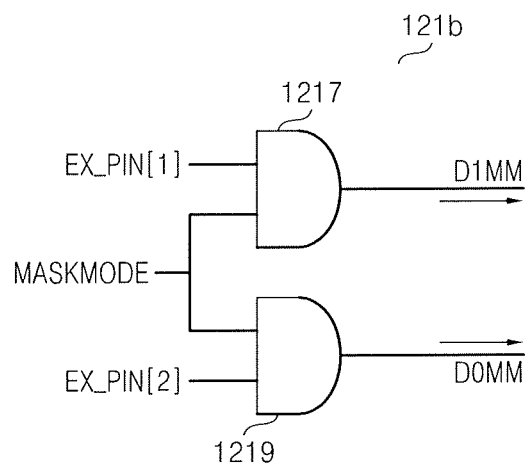
FIG. 14 is a circuit diagram of the mask signal generator illustrated in FIG. 3, according to an exemplary embodiment of the present inventive concept.

FIG. 14 is a circuit diagram of an example 121b of the mask signal generator 121 illustrated in FIG. 3, according to an exemplary embodiment of the present inventive concept. Referring to FIGS. 3 and 14, the mask signal generator 121b may include a third AND gate 1217 and a fourth AND gate 1219.

The third AND gate 1217 may perform an AND operation on a first external input signal EX_PIN[1] and the mask mode enable signal MASKMODE generated according to the TMRS, may generate the first data mask signal D1MM, and may output the same. The fourth AND gate 1219 may perform an AND operation on a second external input signal EX_PIN[2] and the mask mode enable signal MASKMODE, may generate the second data mask signal D0MM, and may output the same.

FIGS. 13 and 14 illustrate the mask signal generator 121 illustrated in FIG. 3 according to exemplary embodiments of the present inventive concept. The inventive concept is not restricted to these embodiments. The mask signal generator 121 may be modified in various ways.

In RDQM methods, as many external input signals as the number of I/O pins connected to a channel are required to externally control masking on the fly. However, according to exemplary embodiments of the present inventive concept, the masking is controlled using only one external input signal EX_PIN or two and thus, the masking is controlled using a lesser number of control signals.

Figure 15:
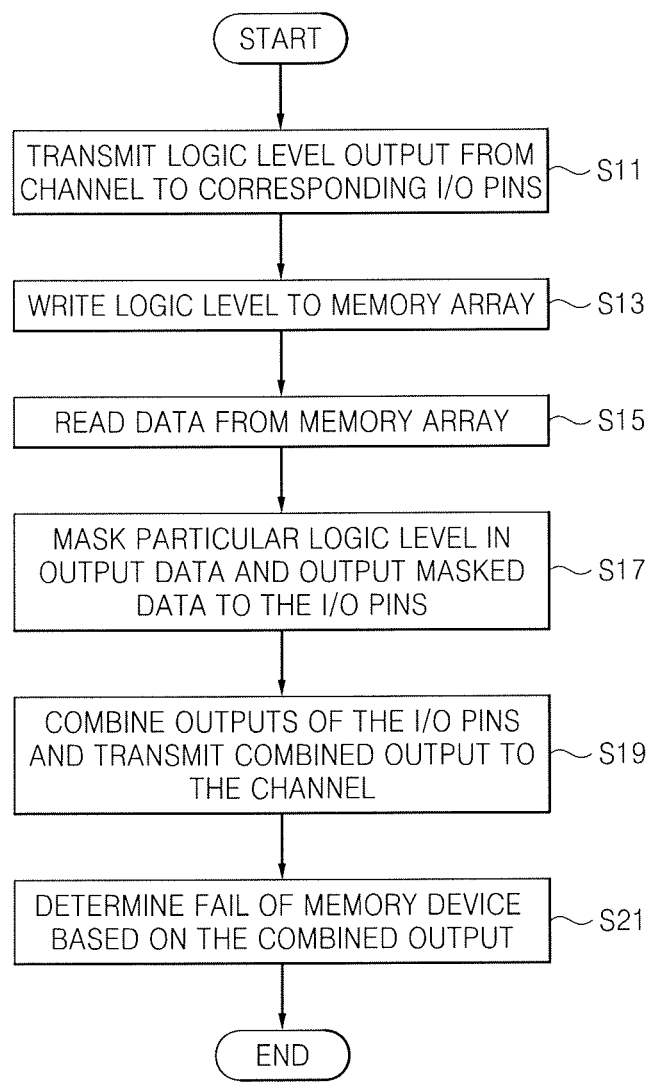
FIG. 15 is a flowchart of a method of testing a memory device according to an exemplary embodiment of the present inventive concept.

FIG. 15 is a flowchart of a method of testing the memory device 100 according to an exemplary embodiment of the present inventive concept. Referring to FIGS. 1, 3, and 15, the coupling circuit 300a transmits a logic level (e.g., a high level or a low level) output from a channel (e.g., the first channel CH1 of the tester 200) to a plurality of corresponding I/O pins (e.g., DQ0 and DQ8) of the memory device 100 in operation S11. The memory device 100 writes the logic level to the memory array 110 in operation S13. The memory device 100 reads data from the memory array 110 in a read operation of the tester 200 in operation S15.

The memory device 100 masks a particular logic level in the output data RD_DATA of the memory array 110 and outputs masked data to the corresponding I/O pins (e.g., DQ0 and DQ8) in operation S17. For instance, the memory device 100 may make the I/O pins DQ0 and DQ8 corresponding to the output data RD_DATA to be in the Hi-Z state when the output data RD_DATA is at the particular logic level. The particular logic level may be a logic level that the I/O pins DQ0 and DQ8 output when the memory device 100 is normal. The particular logic level may be predetermined according to the TMRS. The particular logic level may also be changed on the fly according to an external input signal.

The outputs of the I/O pins (e.g., DQ0 and DQ8) are combined at the coupling circuit 300a and are transmitted to the channel CH1 in operation S19. The tester 200 determines whether there is a fail in the memory device 100 based on the combined output in operation S21.

Figure 16:
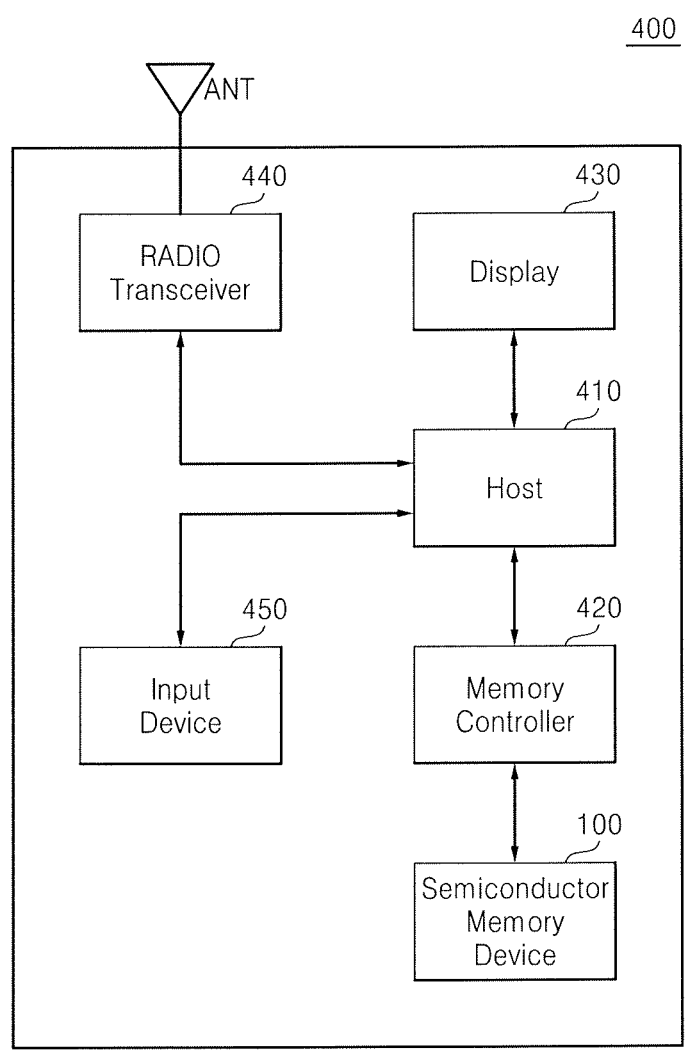
FIG. 16 is a block diagram of a computer system including the memory device illustrated in FIG. 3 according to an exemplary embodiment of the present inventive concept.

FIG. 16 is a block diagram of a computer system 400 including the memory device 100 illustrated in FIG. 3 according to an exemplary embodiment of the present inventive concept. Referring to FIG. 16, the computer system 400 may be implemented as a cellular phone, a smart phone, a tablet personal computer (PC), a personal digital assistant (PDA), a radio communication system, or the like.

The computer system 400 includes the memory device 100 and a memory controller 420 for controlling operations of the memory device 100.

The memory controller 420 may control data access operations (e.g., a write operation or a read operation) of the memory device 100 according to the control of a host 410.

Page data programmed in the memory device 100 may be displayed through a display 430 according to the control of the host 410 and the memory controller 420.

A radio transceiver 440 transmits or receives radio signals through an antenna ANT. The radio transceiver 440 may convert radio signals received through the antenna ANT into signals that can be processed by the host 410. Accordingly, the host 410 may process the signals output from the radio transceiver 440 and may transmit the processed signals to the memory controller 420 or the display 430. The memory controller 420 may program the signals processed by the host 410 to the memory device 100.

The radio transceiver 440 may also convert signals output from the host 410 into radio signals and may output the radio signals to an external device through the antenna ANT.

An input device 450 enables control signals for controlling the operation of the host 410 or data to be processed by the host 410 to be input to the computer system 400. The input device 450 may be implemented by a pointing device (e.g., a touch pad or a computer mouse), a keypad, a keyboard, or the like.

The host 410 may control the operation of the display 430 to display data output from the memory controller 420, data output from the radio transceiver 440, or data output from the input device 450. The memory controller 420, which controls the operations of the memory device 100, may be implemented as a part of the host 410 or as a separate chip.

Figure 17:
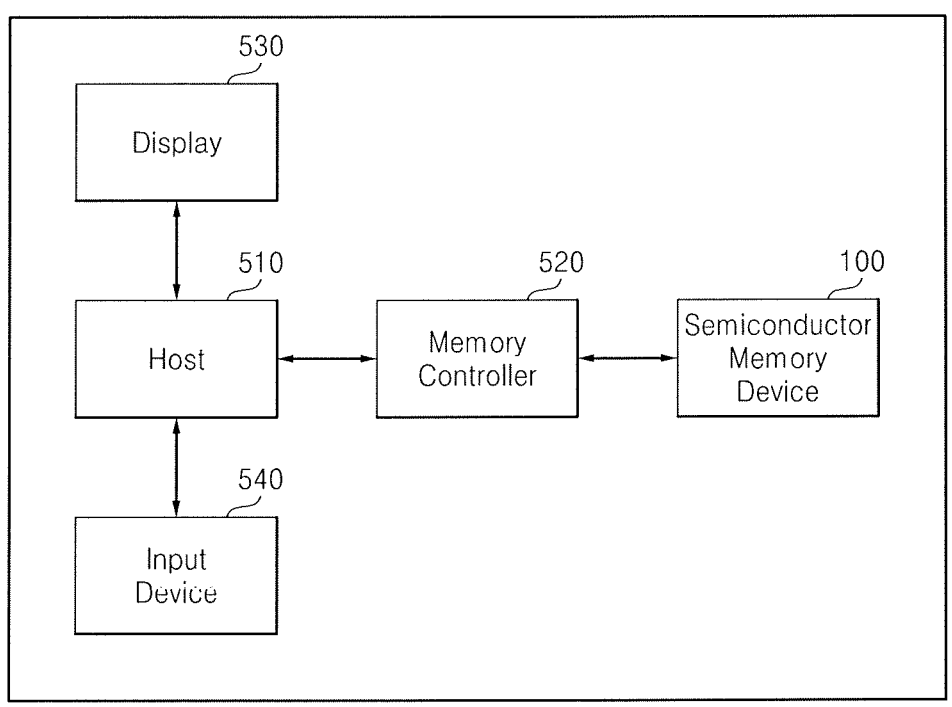
FIG. 17 is a block diagram of a computer system including the memory device illustrated in FIG. 3 according to an exemplary embodiment of the present inventive concept.

FIG. 17 is a block diagram of a computer system 500 including the memory device illustrated in FIG. 3 according to an exemplary embodiment of the present inventive concept. The computer system 500 may be implemented as a personal computer (PC), a tablet PC, a net-book, an e-reader, a personal digital assistant (PDA), a portable multimedia player (PMP), an MP3 player, an MP4 player, or the like.

The computer system 500 includes a host 510, the memory device 100, a memory controller 520, a display 530, and an input device 540. The memory controller 520 may control data processing operations (e.g., a write operation or a read operation) of the memory device 100.

The host 510 may display data stored in the memory device 100 through the display 530 according to data input through the input device 540. The input device 540 may be implemented by a pointing device (e.g., a touch pad or a computer mouse), a keypad, a keyboard, or the like.

The host 510 may control the overall operation of the computer system 500 and the operations of the memory controller 540. The memory controller 540, which may control the operations of the memory device 100, may be implemented as a part of the host 510 or as a separate chip.

Figure 18:
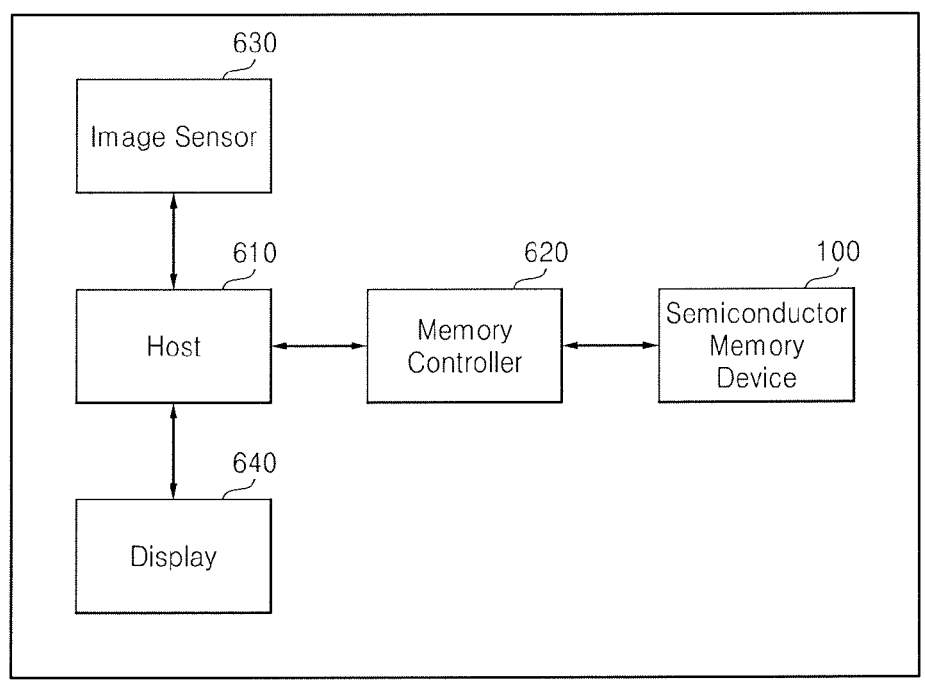
FIG. 18 is a block diagram of a computer system including the memory device illustrated in FIG. 3 according to an exemplary embodiment of the present inventive concept.

FIG. 18 is a block diagram of a computer system 600 including the memory device 100 illustrated in FIG. 3 according to an exemplary embodiment of the present inventive concept. Referring to FIG. 18, the computer system 600 may be implemented as an image processor such as a digital camera, a cellular phone equipped with a digital camera, a smart phone equipped with a digital camera, or the like.

The computer system 600 includes a host 610, the memory device 100, a memory controller 620, an image sensor 630, and a display 640. The memory controller 620 may control data processing operations (e.g., a write operation or a read operation) of the memory device 100.

The image sensor 630 included in the computer system 600 converts optical images into digital signals and outputs the digital signals to the host 610 or the memory controller 620. The digital signals may be controlled by the host 610 to be displayed through the display 640 or stored in the memory device 100 through the memory controller 620.

Data stored in the memory device 100 may be displayed through the display 640 according to the control of the host 610 or the memory controller 620. The memory controller 620, which may control the operations of the memory device 100, may be implemented as a part of the host 610 or as a separate chip.

Figure 19:
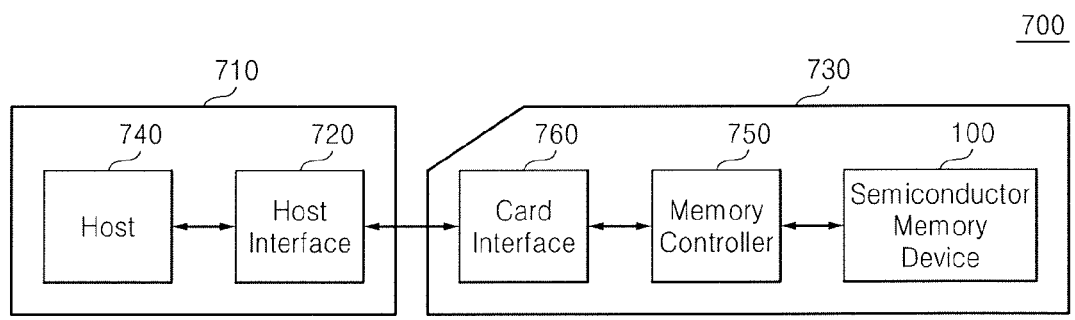
FIG. 19 is a block diagram of a computer system including the memory device illustrated in FIG. 3 according to an exemplary embodiment of the present inventive concept.

FIG. 19 is a block diagram of a computer system 700 including the memory device 100 illustrated in FIG. 3 according to an exemplary embodiment of the present inventive concept.

Referring to FIG. 19, the computer system 700 includes a host computer 710 and a memory card 730. The memory card 730 may be implemented as a smart card.

The host computer 710 includes a host 740 and a host interface 720. The memory card 730 includes the memory device 100, a memory controller 750, and a card interface 760.

The memory controller 750 may control data exchange between the memory device 100 and the card interface 760. The card interface 760 may be a secure digital (SD) card interface or a multi-media card (MMC) interface, but the present inventive concept is not restricted to the current embodiments.

When the memory card 730 is equipped with the host computer 710, the card interface 760 may interface the host 740 and the memory controller 750 for data exchange according to a protocol of the host 740. The card interface 760 may support a universal serial bus (USB) protocol and an interchip (IC)-USB protocol. Here, the card interface 760 may be a hardware supporting a protocol used by the host 740, a software installed in the hardware, or a signal transmission mode.

When the computer system 700 is connected with the host interface 720 of the host computer 710 such as a PC, a tablet PC, a digital camera, a digital audio player, a cellular phone, a console video game hardware, a digital set-top box, or the like, the host interface 720 may perform data communication with the memory device 100 through the card interface 760 and the memory controller 750 according to the control of the host 740.

As described above, according to exemplary embodiments of the present inventive concept, a particular logic level in read data is masked and thus, the number of readings necessary for testing a memory device may be reduced. Thus, a test time for the memory device may be reduced. In addition, since the masking is controlled using only one external input signal or two, the masking may be controlled using a lesser number of control signals.

While the present inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A memory device comprising:
  a memory array configured to output read data comprising a plurality of data bits;
  a plurality of input/output pins;
  a mask signal generator configured to generate at least one data mask signal; and
  an input/output block configured to output the read data to the plurality of input/output pins,
  wherein the read data output to the plurality of input/output pins includes at least one data bit that has been masked and at least one data bit that has not been masked,
  wherein only read data bits having a first logic level are masked by the at least one data mask signal.

2. The memory device of claim 1, wherein the at least one data mask signal is generated based on a logic level output from the plurality of input/output pins when the memory device is normal.

3. The memory device of claim 1, wherein the input/output block comprises a plurality of input/output circuits respectively corresponding to the input/output pins,
  wherein at least one of the input/output circuits comprises:
  a pull-up unit configured to mask a PMOS enable signal according to a first data mask signal among the at least one data mask signal to generate a PMOS masking signal, and to pull up a corresponding input/output pin among the plurality of input/output pins according to the PMOS masking signal; and
  a pull-down unit configured to mask an NMOS enable signal according to a second data mask signal among the at least one data mask signal to generate an NMOS masking signal and to pull down the corresponding input/output pin according to the NMOS masking signal,
  wherein the PMOS enable signal and the NMOS enable signal correspond to the read data.

4. The memory device of claim 3, wherein the pull-up unit comprises a pull-up transistor connected between a first reference voltage and the corresponding input/output pin to pull up the corresponding input/output pin according to the PMOS masking signal, the pull-down unit comprises a pull-down transistor connected between a second reference voltage and the corresponding input/output pin to pull down the corresponding input/output pin according to the NMOS masking signal, the pull-up transistor is deactivated when the first data mask signal is activated, and the pull-down transistor is deactivated when the second data mask signal is activated.

5. The memory device of claim 3, wherein the pull-up unit comprises a pull-up inverter configured to invert the PMOS enable signal and a pull-up NOR gate configured to perform a NOR operation on the inverted PMOS enable signal and the first data mask signal to generate the PMOS masking signal, and the pull-down unit comprises a pull-down inverter configured to invert the NMOS enable signal and a pull-down NOR gate configured to perform a NOR operation on the inverted NMOS enable signal and the second data mask signal to generate the NMOS masking signal.

6. The memory device of claim 1, wherein the at least one data mask signal is a first data mask signal for masking a high level in the read data according to at least one external input signal input to the memory device or a second data mask signal for masking a low level in the read data according to the at least one external input signal input to the memory device.

7. The memory device of claim 6, wherein the mask signal generator comprises:

a first AND gate configured to perform an AND operation on the external input signal and a mask mode signal generated according to a test mode register set (TMRS), and to generate the first data mask signal;

an inverter configured to invert the external input signal; and a second AND gate configured to perform an AND operation on the inverted external input signal and the mask mode signal, and to generate the second data mask signal.

8. The memory device of claim 6, wherein the mask signal generator comprises:

a third AND gate configured to perform an AND operation on a first external input signal among the at least one external input signal and a mask mode signal generated according to a test mode register set (TMRS), and to generate the first data mask signal; and a fourth AND gate configured to perform an AND operation on a second external input signal among the at least one external input signal and the mask mode signal, and to generate the second data mask signal.

9. The memory device of claim 1, wherein at least two input/output pins of the plurality of input/output pins are connected to a single channel of a tester.

10. A method of testing a memory device including a plurality of input/output pins and a memory array, the method comprising:

masking bits having a first logic level in output data of the memory array;

transmitting the masked output data to corresponding input/output pins among the plurality of input/output pins; and determining whether a fail occurs in the memory device based on a combined output generated by combining outputs of the corresponding input/output pins.

11. The method of claim 10, wherein the first logic level is a logic level at the corresponding input/output pins when the memory device is normal.

12. The method of claim 10, wherein the masking of the bits having the first logic level in the output data comprises putting the corresponding input/output pins to be in a high-impedance state when the output data is at the first logic level.

13. The method of claim 10, wherein the first logic level is determined according to a test mode register set (TMRS).

14. The method of claim 10, wherein the first logic level changes according to an external input signal.

15. The method of claim 10, wherein the method is repeated according to a number of logic levels of the output data when the memory device is normal.

16. A memory device, comprising:

a memory array configured to output read data comprising a plurality of data bits;

N input/output pins;

a read control circuit configured to receive the read data, and to generate N PMOS enable signals and N NMOS enable signals based on the read data;

an input/output block including N input/output circuits; and a mask signal generator configured to generate at least one data mask signal, wherein each of the N input/output circuits is configured to mask only data bits having a first logic level among the plurality of data bits in the read data in response to the at least one data mask signal, and wherein each of the N input/output circuits is connected to a corresponding one of the N input/output pins.

17. The memory device of claim 16, wherein the at least one data mask signal is determined based on at least one external input signal input to the memory device.

18. The memory device of claim 17, wherein at least one of the N input/output circuits comprises:

a pull-up unit configured to mask a PMOS enable signal according to a first data mask signal among the at least one data mask signal to generate a PMOS masking signal and to pull up the corresponding one of the N input/output pins according to the PMOS masking signal; and a pull-down unit configured to mask an NMOS enable signal according to a second data mask signal among the at least one data mask signal to generate an NMOS masking signal and to pull down the corresponding one of the N input/output pins according to the NMOS masking signal, wherein the PMOS enable signal and the NMOS enable signal pertain to the read data.

19. The memory device of claim 18, wherein the mask signal generator comprises:

a first AND gate configured to perform an AND operation on a first external input signal among the at least one external input signal and a mask mode signal generated according to a test mode register set (TMRS), and to generate the first data mask signal; and a second AND gate configured to perform an AND operation on a second external input signal among the at least one external input signal and the mask mode signal, and to generate the second data mask signal.

* * * * *